(12) United States Patent
Terashima

(10) Patent No.: US 11,901,328 B2
(45) Date of Patent: Feb. 13, 2024

(54) SEMICONDUCTOR DEVICE

(71) Applicant: FUJI ELECTRIC CO., LTD., Kawasaki (JP)

(72) Inventor: Kenshi Terashima, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 352 days.

(21) Appl. No.: 17/332,590

(22) Filed: May 27, 2021

(65) Prior Publication Data

US 2021/0288020 A1 Sep. 16, 2021

Related U.S. Application Data

(63) Continuation of application No. PCT/JP2020/017826, filed on Apr. 24, 2020.

(30) Foreign Application Priority Data

Jun. 12, 2019 (JP) .................................. 2019-109496

(51) Int. Cl.
*H01L 23/00* (2006.01)
*H01L 25/07* (2006.01)
*H01L 25/18* (2023.01)

(52) U.S. Cl.
CPC ............ *H01L 24/49* (2013.01); *H01L 24/05* (2013.01); *H01L 24/48* (2013.01); *H01L 25/07* (2013.01);
(Continued)

(58) Field of Classification Search
CPC ......... H01L 24/49; H01L 24/05; H01L 24/48; H01L 24/45; H01L 25/07; H01L 25/18; H01L 25/072; H01L 23/62
See application file for complete search history.

(56) References Cited

U.S. PATENT DOCUMENTS

2019/0139880 A1\* 5/2019 Jakobi ..................... H01L 24/48
2020/0116780 A1 4/2020 Kawahara et al.

FOREIGN PATENT DOCUMENTS

JP S63-213968 A 9/1988
JP 2006-165151 A 6/2006
(Continued)

OTHER PUBLICATIONS

International Search Report for PCT/JP2020/017826, dated Jun. 30, 2020.
Written Opinion for PCT/JP2020/017826, dated Jun. 30, 2020.

*Primary Examiner* — Marc Anthony Armand
(74) *Attorney, Agent, or Firm* — Rabin & Berdo, P.C.

(57) ABSTRACT

A semiconductor device includes a first semiconductor chip including an output electrode portion on a front surface thereof, the output electrode portion including a plurality of electrode regions, each of which is provided at a respective position of the output electrode portion, and a plurality of wires, each electrode region being connected to a different one or more wires among the plurality of wires, through which a respective amount of output current is output. A total number of the different one or more wires connected to each electrode region is set depending on the respective position of the electrode region of the output electrode portion, so that the electrode region has a respective current amount per wire that is equal to or less than a respective predetermined value.

14 Claims, 12 Drawing Sheets

(52) U.S. Cl.
CPC .... *H01L 25/18* (2013.01); *H01L 2224/04042* (2013.01); *H01L 2224/06051* (2013.01); *H01L 2224/48091* (2013.01); *H01L 2224/48111* (2013.01); *H01L 2224/48137* (2013.01)

(56) References Cited

FOREIGN PATENT DOCUMENTS

| | | |
|---|---|---|
| JP | 2008-186957 A | 8/2008 |
| JP | 2018-014354 A | 1/2018 |
| WO | 2018/211735 A1 | 11/2018 |

\* cited by examiner

SEMICONDUCTOR DEVICE

CROSS-REFERENCE TO RELATED APPLICATION

This application is a continuation application of International Application PCT/JP2020/017826 filed on Apr. 24, 2020 which designated the U.S., which claims priority to Japanese Patent Application No. 2019-109496, filed on Jun. 12, 2019, the entire contents of which are incorporated herein by reference.

BACKGROUND OF THE INVENTION

1. Field of the Invention

The present embodiment relates to a semiconductor device.

2. Background of the Related Art

Semiconductor devices include semiconductor elements such as insulated gate bipolar transistors (IGBTs) or free wheeling diodes (FWDs). These semiconductor elements, etc. are electrically connected to each other via wires, and the semiconductor devices are consequently used as power conversion devices, for example. In this case, when a current flows through a wire, the wire generates heat due to its resistance. In particular, depending on the layout of the semiconductor elements, etc., a long wire needs to be used. If the length of the wire is more than a predetermined length, the wire generates more heat. To address this, in wiring regions where these long wires are arranged, the number of wires may be increased. In this way, the current flowing through a single wire is reduced, and increase in the amount of heat is prevented.

Please see, for example, Japanese Laid-open Patent Publication No. 2018-014354

However, even if the number of long wires is increased, the heat generated by the wires is not sufficiently reduced in reality. In addition, the bonding area of the semiconductor elements limits the number of connectable wires. Thus, as the temperature of a wire rises, the wire could fuse. In addition, if the temperature rise and drop of a wire is repeated as a current flows through the wire and the wire is heated, a connection part of the wire will be peeled. In this case, the semiconductor device is unable to secure sufficient power cycle lifetime, and the reliability of the semiconductor device is reduced.

SUMMARY OF THE INVENTION

According to an aspect, there is provided a semiconductor device, including: a first semiconductor chip including an output electrode portion on a front surface thereof, the output electrode portion including a plurality of electrode regions, each of which is provided at a respective position of the output electrode portion; and a plurality of wires, each electrode region being connected to a different one or more wires among the plurality of wires, through which a respective amount of output current is output, wherein a respective total number of the different one or more wires connected to each electrode region is set depending on the respective position of the electrode region, so that a respective current amount of each of the different one or more wires connected to the electrode region is equal to or less than a respective predetermined value associated with the electrode region.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, an embodiment will be described with reference to drawings. In the following description, "front surface" and "top surface" each mean an upward surface of a semiconductor device 10 in FIG. 1. Likewise, "up" means the upward direction of the semiconductor device 10 in FIG. 1. In addition, "rear surface" and "bottom surface" each mean a downward surface of the semiconductor device 10 in FIG. 1. Likewise, "down" means the downward direction of the semiconductor device 10 in FIG. 1. In the other drawings as well, the above terms mean their respective directions, as needed. The terms "front surface", "top surface", "up", "rear surface", "bottom surface", "down", and "side surface" are simply used as convenient expressions to determine relative positional relationships and are not intended to limit the technical concepts of the embodiment. For example, the terms "up" and "down" may mean directions other than the vertical directions with respect to the ground. That is, the directions expressed by "up" and "down" are not limited to the directions relating to the gravitational force.

Figure 1:
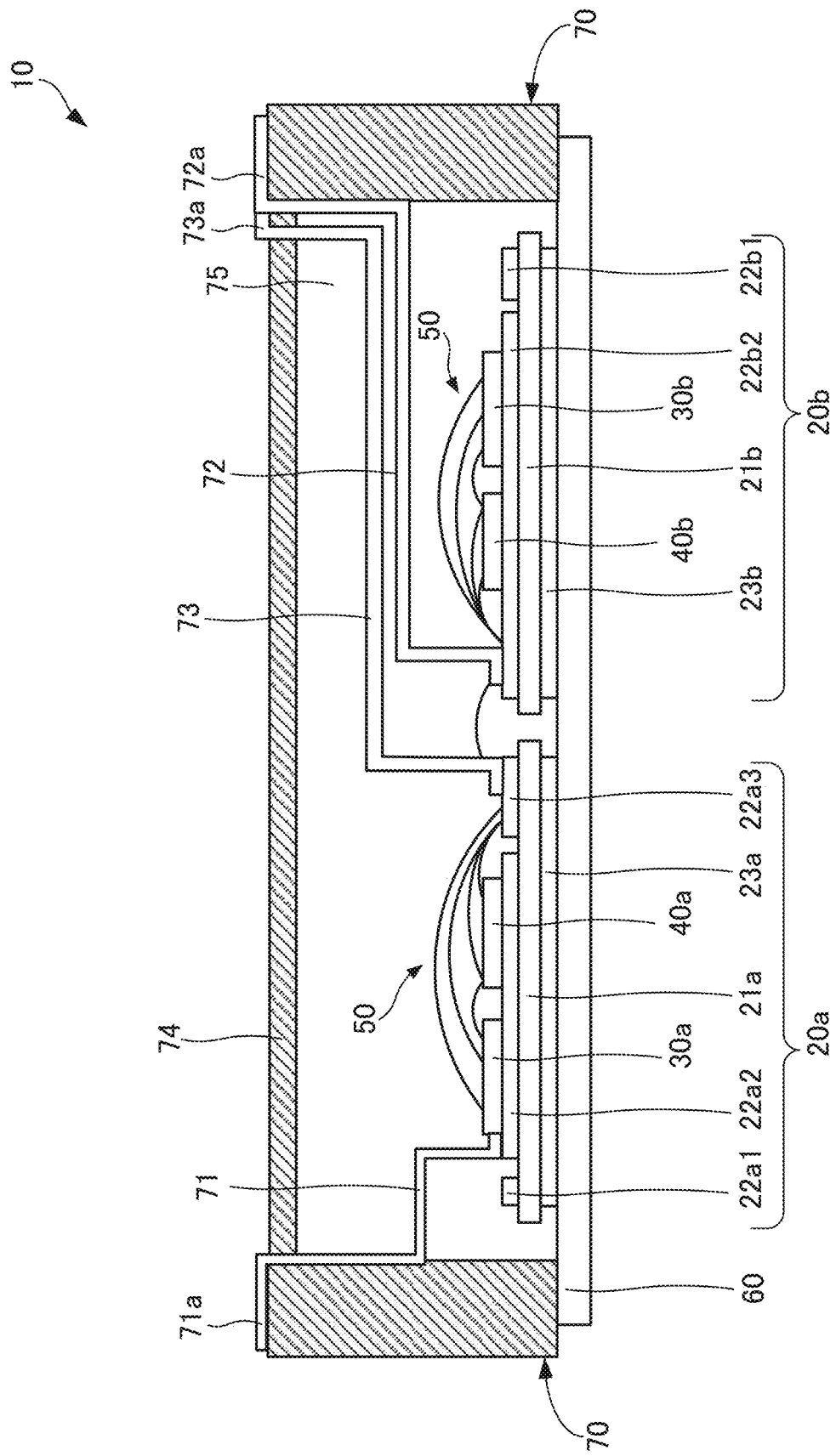
FIG. 1 is a sectional view of a semiconductor device according to an embodiment.
Figure 2:
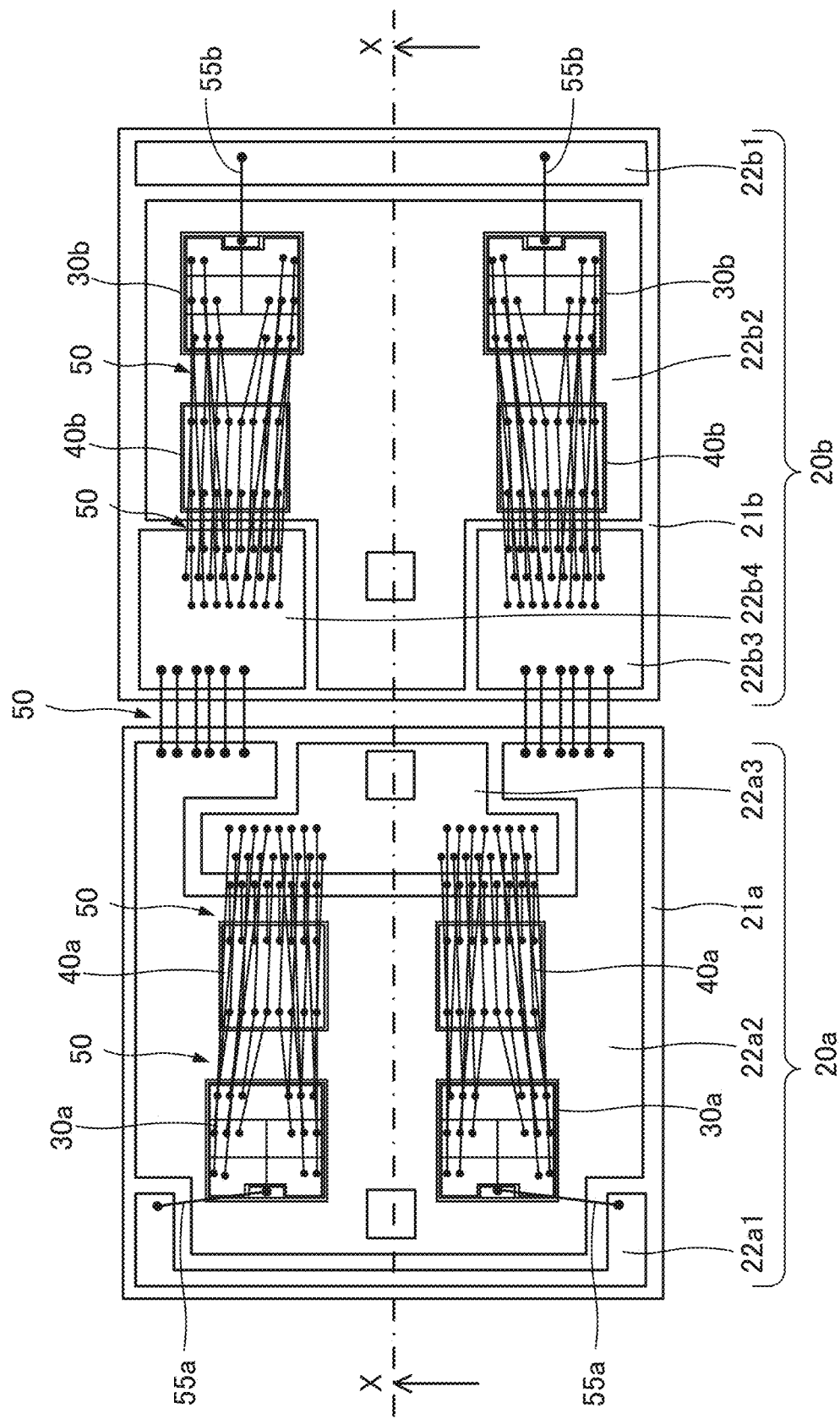
FIG. 2 is a plan view of the semiconductor device according to the embodiment.

A semiconductor device according to an embodiment will be described with reference to FIGS. 1 and 2. FIG. 1 is a sectional view of a semiconductor device according to an embodiment. FIG. 2 is a plan view of the semiconductor device according to the embodiment. FIG. 1 is a sectional view of a portion of the semiconductor device taken along a dashed-dotted line X-X in FIG. 2. FIG. 2 illustrates only ceramic circuit boards 20$a$ and 20$b$ of this semiconductor device 10.

As illustrated in FIG. 1, the semiconductor device 10 includes the ceramic circuit boards 20$a$ and 20$b$ and a heat radiation plate 60. As illustrated in FIG. 2, semiconductor chips 30$a$ and 40$a$ are arranged on the ceramic circuit board 20$a$, and semiconductor chips 30$b$ and 40$b$ are arranged on the ceramic circuit board 20$b$. In addition, the semiconductor device 10 includes a case part 70 and a lid part 74 disposed at the upper opening of the case part 70. The case part 70 encloses the ceramic circuit boards 20$a$ and 20$b$ and is bonded to the peripheral region of the heat radiation plate 60 via adhesive (not illustrated). In addition, wiring members 71, 72, and 73 are attached to the case part 70 and the lid part 74. One end of the wiring member 71 is electrically connected to the ceramic circuit board 20$a$, and a terminal 71$a$, which is the other end of the wiring member 71, is exposed on the case part 70. One end of the wiring member 72 is electrically connected to the ceramic circuit board 20$b$, and a terminal 72$a$, which is the other end of the wiring member 72, is exposed on the case part 70. One end of the wiring member 73 is electrically connected to the ceramic circuit board 20$a$, and a terminal 73$a$, which is the other end of the wiring member 73, is exposed on the case part 70. The ceramic circuit boards 20$a$ and 20$b$ inside the case part 70 are sealed with sealing material 75. In this case, this sealing material 75 is silicone gel or sealing resin.

As illustrated in FIGS. 1 and 2, the ceramic circuit board 20$a$ includes an insulating plate 21$a$, conductive patterns 22$a$1 to 22$a$3 formed on the front surface of the insulating plate 21$a$, and a metal plate 23$a$ formed on the rear surface of the insulating plate 21$a$. Likewise, the ceramic circuit board 20$b$ includes an insulating plate 21$b$, conductive patterns 22$b$1 to 22$b$4 formed on the front surface of the insulating plate 21$b$, a metal plate 23$b$ formed on the rear surface of the insulating plate 21$b$. The shapes and the number of conductive patterns 22$a$1 to 22$a$3 and 22$b$1 to 22$b$4 are examples. The insulating plates 21$a$ and 21$b$ are each made of highly heat-conductive ceramic material having excellent thermal conductivity. This ceramic material is, for example, aluminum oxide, aluminum nitride, or silicon nitride. The conductive patterns 22$a$1 to 22$a$3 and 22$b$1 to 22$b$4 are each made of metal material having excellent electrical conductivity. This metal material is, for example, copper or a copper alloy. The metal plates 23$a$ and 23$b$ are each made of metal material having excellent thermal conductivity. Examples of this metal material include aluminum, iron, silver, copper, and an alloy containing at least one kind of these elements. For example, a direct copper bonding (DCB) board or an active metal brazed (AMB) board may be used as the above ceramic circuit board 20$a$ or 20$b$. With the ceramic circuit boards 20$a$ and 20$b$, the heat generated by the semiconductor chips 30$a$, 30$b$, 40$a$, and 40$b$ is conducted and released in the lower direction in FIG. 1 via the conductive patterns 22$a$2 and 22$b$2, the insulating plates 21$a$ and 21$b$, and the metal plates 23$a$ and 23$b$. The conductive patterns 22$a$1 to 22$a$3 and 22$b$1 to 22$b$4 each have a thickness preferably between 0.10 mm and 1.00 mm, inclusive, more preferably, between 0.20 mm and 0.50 mm, inclusive. In addition, the wiring member 71 is connected to the conductive pattern 22$a$2 of the ceramic circuit board 20$a$ via solder (not illustrated). The wiring member 72 is connected to the conductive pattern 22$b$2 via solder (not illustrated). The wiring member 73 is connected to the conductive pattern 22$a$3 via solder (not illustrated). Rectangles illustrated in the conductive patterns 22$a$2, 22$b$2, and 22$a$3 represent connection regions of the wiring members 71, 72, and 73.

The semiconductor chips 30$a$ and 30$b$ are each made of silicon or silicon carbide. The semiconductor chips 30$a$ and 30$b$ each include switching elements. Examples of the switching elements include IGBTs and power metal-oxide-semiconductor field-effect transistors (MOSFETs). These semiconductor chips 30$a$ and 30$b$ each have, for example, an input electrode (a drain electrode or a collector electrode) as a main electrode on its rear surface and a control electrode (a gate electrode) and an output electrode (a source electrode or an emitter electrode) as a main electrode on its front surface. The rear surfaces of the semiconductor chips 30$a$ and 30$b$ are connected to the conductive patterns 22$a$2 and 22$b$2, respectively, via solder (not illustrated). The semiconductor chips 40$a$ and 40$b$ are made of silicon or silicon carbide. The semiconductor chips 40$a$ and 40$b$ each include diodes. Examples of the diodes include Schottky barrier diodes (SBDs) and FWDs. These semiconductor chips 40$a$ and 40$b$ each have an output electrode (a cathode electrode) as a main electrode on its rear surface and an input electrode (an anode electrode) as a main electrode on its front surface. The rear surfaces of the semiconductor chips 40$a$ and 40$b$ are connected to the conductive patterns 22$a$2 and 22$b$2, respectively, via solder (not illustrated).

Wires 50 are connected to these ceramic circuit boards 20$a$ and 20$b$ and the semiconductor chips 30$a$, 30$b$, 40$a$, and 40$b$, as will be described below. In FIGS. 1 and 2, the wires other than control wires are collectively denoted as the wires 50. These wires 50 connect various portions and are used as main current wires for input and output currents. In contrast, wires 55$a$ and 55$b$ are the control wires. The wires 55$a$ electrically connect the conductive pattern 22$a$1 and the gates of the semiconductor chips 30$a$. The wires 55$b$ electrically connect the conductive pattern 22$b$1 and the gates of the semiconductor chips 30$b$. The wires 50, which serve as the main current wires, electrically connect the semiconductor chips 30$a$ and 30$b$, the semiconductor chips 40$a$ and 40$b$, and the conductive patterns 22$a$3, 22$b$3, and 22$b$4, as needed. The wires 50, 55$a$, and 55$b$ are made of metal material having excellent electrical conductivity. Examples of the metal material include aluminum, copper, and an alloy containing at least one kind of these elements. In addition, the diameter of each of these wires is preferably between 100 μm and 1.00 mm, inclusive. The diameter of each of the wires 50, which serve as the main current wires, is preferably between 250 μm and 500 μm, inclusive. If any one of the wires is thinner than its corresponding range, the current capacity becomes insufficient, and the wire could be ruptured. If any one of the wires is thicker than its corresponding range, when the wire is bonded to a semiconductor chip 30$a$ or 30$b$, the semiconductor chip 30$a$ or 30$b$ could be damaged.

The wiring members 71, 72, and 73 are made of metal material having excellent electrical conductivity. Examples of the metal material include aluminum, iron, silver, copper, and an alloy containing at least one kind of these elements. To improve the corrosion resistance of the wiring members 71, 72, and 73, for example, the surfaces of the wiring members 71, 72, and 73 may be plated with metal material such as nickel or gold. Specifically, other than nickel and gold, examples of the plating material include a nickel-phosphorus alloy and a nickel-boron alloy. Gold may be accumulated on a nickel-phosphorus alloy.

The heat radiation plate 60 is disposed on the ceramic circuit boards 20a and 20b via solder (not illustrated). The heat radiation plate 60 is made of metal material having excellent thermal conductivity. Examples of this metal material include aluminum, iron, silver, copper, and an alloy containing at least one kind of these elements. In addition, to improve the corrosion resistance of the heat radiation plate 60, for example, the surface of the heat radiation plate 60 may be plated with metal material such as nickel. Specifically, other than nickel, examples of the plating material include a nickel-phosphorus alloy and a nickel-boron alloy. A cooling unit (not illustrated) may be attached to the rear surface of the heat radiation plate 60 via solder, silver soler, or the like. In this way, the heat radiation performance is improved. The cooling unit in this case is made of metal material having excellent thermal conductivity. Examples of the metal material include aluminum, iron, silver, copper, and an alloy containing at least one kind of these elements. A heatsink or a water-cooled device having at least one fin may be applied as the cooling unit. The heat radiation plate 60 may be formed integrally with the cooling unit as described above. In this case, the heat radiation plate 60 and the cooling unit are made of metal material having excellent thermal conductivity. Examples of this metal material also include aluminum, iron, silver, copper, and an alloy containing at least one kind of these elements. To improve the corrosion resistance, for example, the surface of the heat radiation plate 60 formed integrally with the cooling unit may be plated with material such as nickel. Specifically, other than nickel, examples of the plating material include a nickel-phosphorus alloy and a nickel-boron alloy. The case part 70 has a box shape, and the lid part 74 has a flat plate shape, for example. The case part 70 and the lid part 74 are both made of thermoplastic resin. Example of the resin include PPS resin, PBT resin, PBS resin, PA resin, and ABS resin. In addition, the case part 70 and the lid part 74 are provided with openings (not illustrated) into which the terminals 71a, 72a, and 73a of the wiring members 71, 72, and 73 are inserted.

Figure 3:
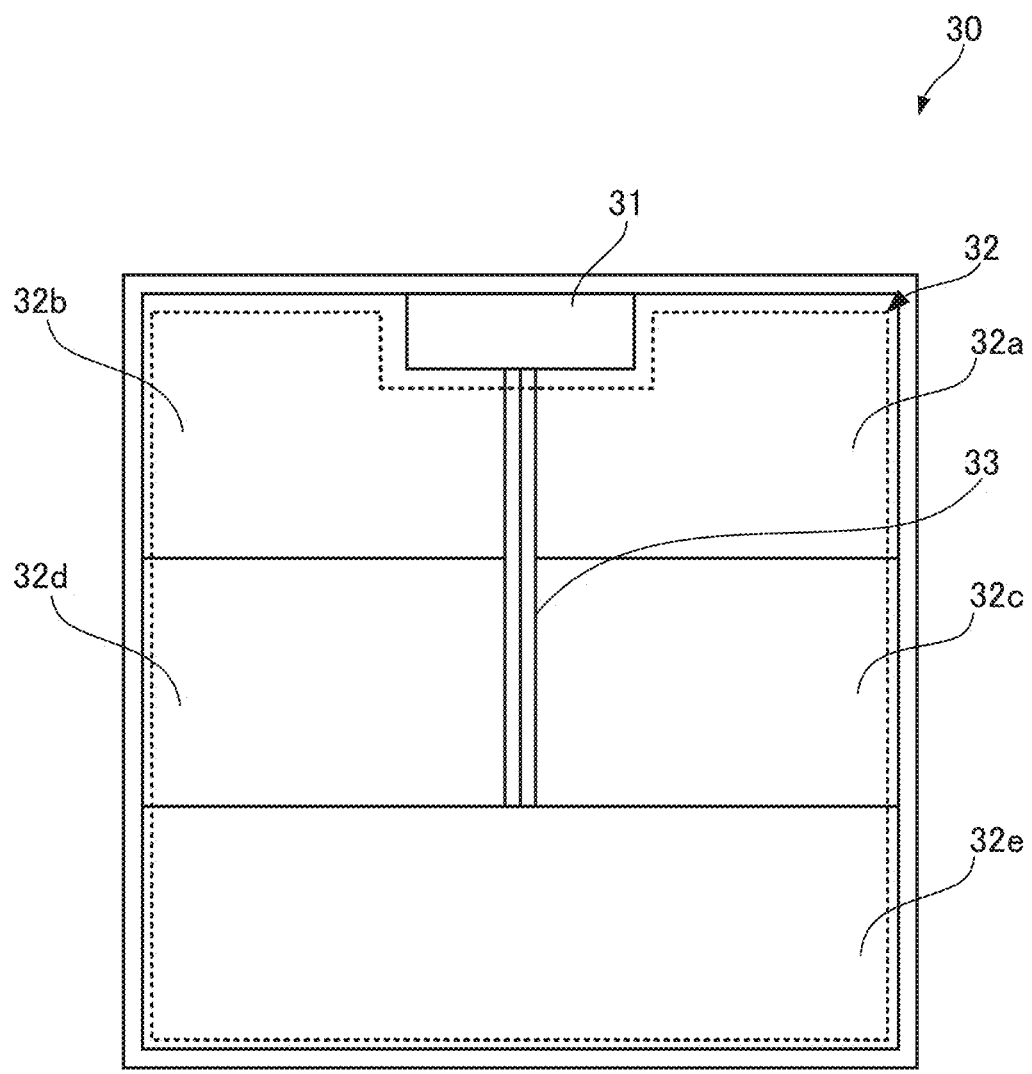
FIG. 3 is a plan view of a semiconductor chip according to the embodiment.

Next, the semiconductor chips 30a and 30b will be described in detail with reference to FIG. 3. Hereinafter, the semiconductor chips 30a and 30b will collectively be referred to as semiconductor chips 30. FIG. 3 is a plan view of a semiconductor chip according to the embodiment. This semiconductor chip 30 has a rectangular shape in a plan view. The semiconductor chip 30 has a gate 31 (a control electrode portion) at a center portion of an edge portion of the front surface of the semiconductor chip 30 and an active region 32 (an output electrode portion). For example, the vertical size of this semiconductor chip 30 is 12 mm, and the horizontal size is 10 mm.

The gate 31 receives a control voltage. When wires 50 are connected to the active region 32 and the semiconductor chip 30 is set in an on-state, the individual output currents are outputted from the active region 32. As illustrated in FIG. 3, the active region 32 is formed by electrode regions 32a and 32b, electrode regions 32c and 32d, and an electrode region 32e, which are arranged in a direction (an extension direction) from the gate 31 to an edge portion facing the gate 31. In addition, each of the electrode regions 32a, 32b, 32c, 32d, and 32e is a transistor region in which a plurality of IGBTs are formed. Each of the electrode regions 32a, 32b, 32c, 32d, and 32e may be provided with a plurality of IGBTs and a plurality of free wheeling diodes. These electrode regions 32a, 32b, 32c, 32d, and 32e are insulated from each other and each output a separate output current. The active region 32 also includes a gate runner 33, which extends from the gate 31 to the electrode regions 32c and 32d in the extension direction. That is, the gate runner 33 is formed along the boundary between the electrode regions 32a and 32c serving as transistor regions and the boundary between the electrode regions 32b and 32d serving as transistor regions. Thus, the electrode regions 32a and 32b and the electrode region 32c and 32d are sequentially arranged in this order in the extension direction on both sides of the gate runner 33. In this case, any one of the plurality of electrode regions 32a, 32b, 32c, 32d, and 32e is identified based on how much this electrode region is separated from the gate 31 in the extension direction (a separation location). For example, if the separation location corresponds to the first row, the electrode regions 32a and 32b (nearest electrode regions) are identified. If the separation location corresponds to the second row, the electrode regions 32c and 32d (intermediate electrode regions) are identified. If the separation location corresponds to the third row, the electrode region 32e (a farthest electrode region) is identified.

The gate runner 33 is electrically connected to the gates of the individual IGBTs (or power MOSFETs) of the electrode regions 32a, 32b, 32c, 32d, and 32e. In the active region 32, an electrode region that is separated farther from the gate 31 in the extension direction of the gate runner 33 has a larger area. For example, the electrode regions 32a and 32b each have an area of 10.6 mm$^2$ and output an output current of 30.7 amperes (A). The electrode regions 32c and 32d each have an area of 11.9 mm$^2$ and output an output current of 34.5 A. The electrode region 32e has an area of 24.5 mm$^2$ and outputs an output current of 71.0 A.

Figure 4:
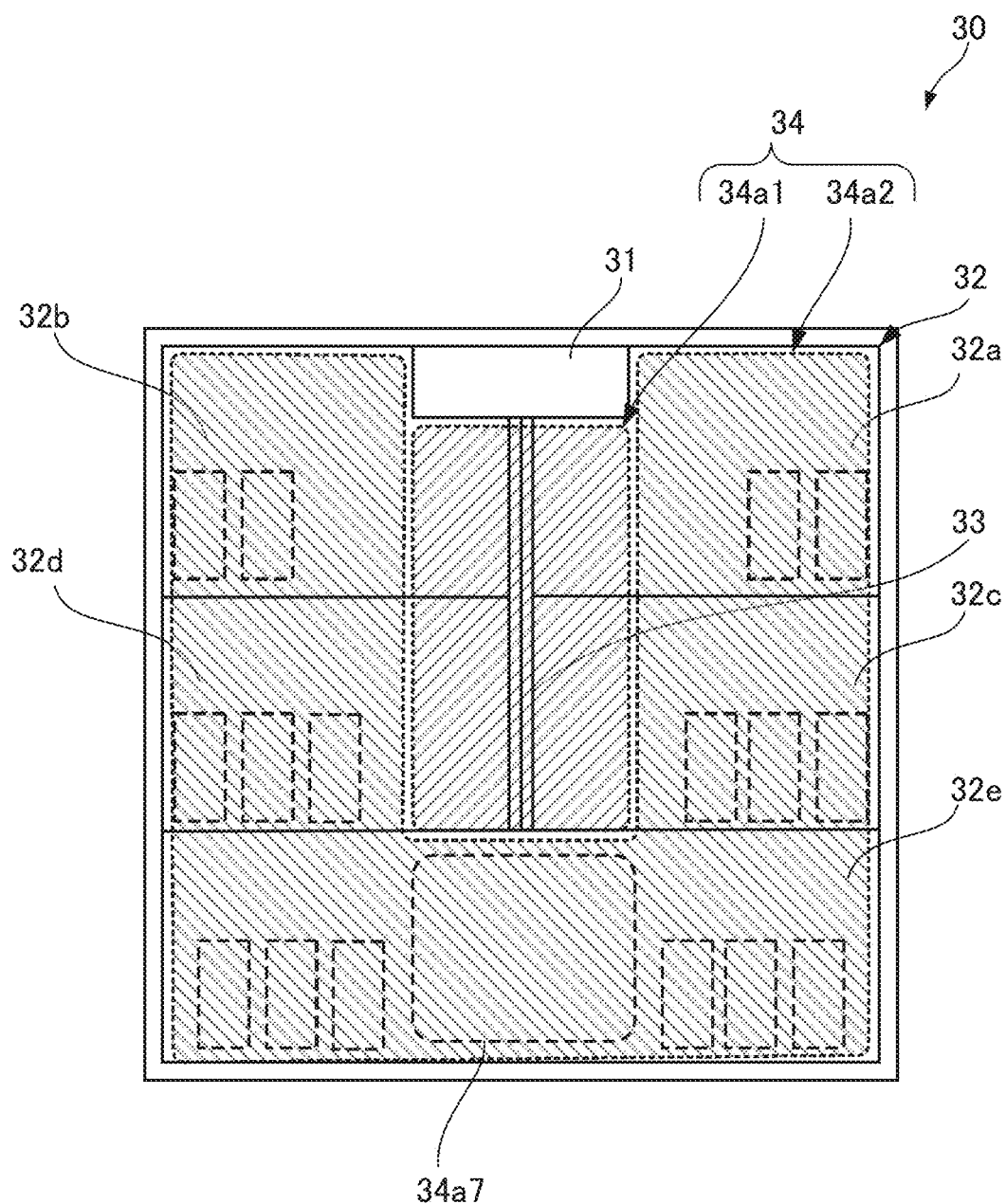
FIG. 4 is a first diagram illustrating wire bonding portions of the semiconductor chip according to the embodiment.
Figure 5:
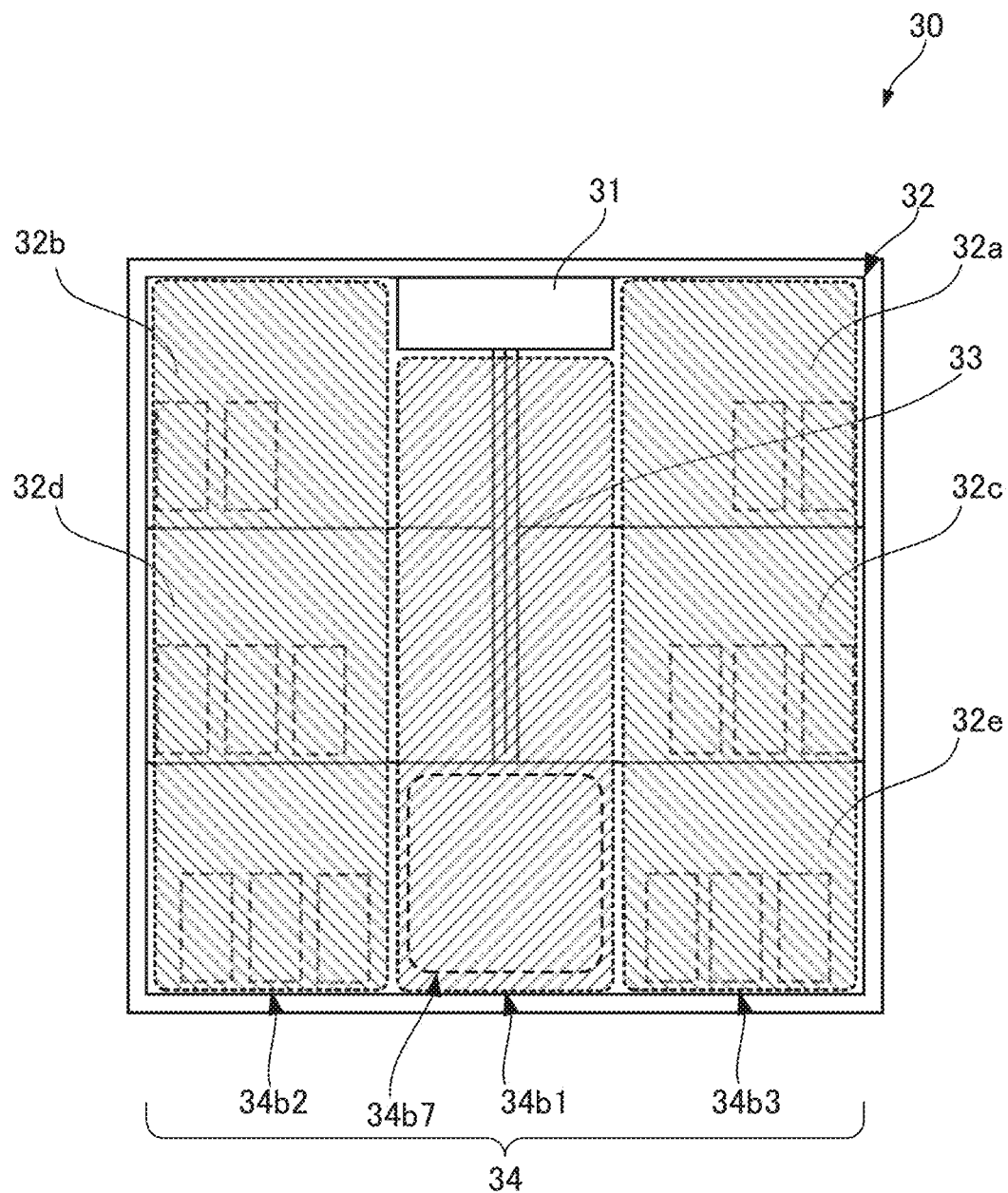
FIG. 5 is a second diagram illustrating the wire bonding portions of the semiconductor chip according to the embodiment.

Next, wire bonding portions of this semiconductor chip 30 will be described with reference to FIG. 4. FIGS. 4 and 5 illustrate wire bonding portions of the semiconductor chip according to the embodiment. In FIG. 4, predetermined areas of the semiconductor chip 30 in FIG. 3 are hatched to distinguish various regions. As illustrated in FIG. 4, wires 50 are bonded to dashed rectangular regions in the electrode regions 32a, 32b, 32c, 32d, and 32e of the semiconductor chip 30. As illustrated in FIG. 4, a center region 34a1 and a (U-shaped) peripheral region 34a2 around the center region 34a1 are set on a front surface 34 of the semiconductor chip 30. The center region 34a1 is defined by the width of the individual long side of the gate 31 on the front surface 34 and the length of the gate runner 33. In addition, in the peripheral region 34a2, an extension center region 34a7 is set ahead in the extension direction of the center region 34a1.

With this semiconductor chip 30, when a control voltage is applied to the gate 31, the control voltage is applied to the gates of the individual IGBTs of the electrode regions 32a, 32b, 32c, 32d, and 32e via the gate runner 33. Thus, the temperature at the portions around the gate 31 and the gate runner 33 will rise. A portion that is separated farther from the gate runner 33 perpendicularly is less affected by the temperature rise. That is, it is thought that the temperature of the center region 34a1 of the semiconductor chip 30 is higher than that of the peripheral region 34a2. As the voltage is repeatedly applied to the gate 31, the temperature rise and drop at the center region 34a1 is repeated. For example, a wire 50 bonded to this center region 34a1 is easily peeled by such a temperature difference. To avoid this, in the case of the semiconductor chip 30, wires 50 are bonded to the electrode regions 32a, 32b, 32c, and 32d in the peripheral region 34a2 outside the center region 34a1. In particular, wires 50 are bonded to portions both sides of the extension center region 34a7 in the electrode region 32e.

In addition, a predetermined number of wires 50 are connected to an individual one of the electrode regions 32a, 32b, 32c, 32d, and 32e. This number depends on the area and the location of the corresponding electrode region. The predetermined number of wires 50 is the minimum number of wires 50 with which the temperature rise is reduced. In this way, when currents are outputted from the electrode regions 32a, 32b, 32c, 32d, and 32e, an output current that flows through a single wire 50 (a current amount per unit number) represents a predetermined value or less, and the heat generated by a single wire 50 is reduced. For example, in the case of the semiconductor chip 30, two wires 50 each having a diameter of 400 μm may be connected to an area of 11 mm$^2$ or less. Three wires 50 each having a diameter of 400 μm may be connected to an area of 12 mm$^2$ or less. Six wires 50 each having a diameter of 400 μm may be connected to an area, which is between 22 mm$^2$ and 25 mm$^2$, inclusive. In these cases, the predetermined value of the output current is 15.5 A/wire. Thus, two wires 50 are bonded to each of the electrode regions 32a and 32b (whose area is 10.6 mm$^2$). In this case, the output current that flows through each wire 50 is 15.3 A. In addition, three wires 50 are bonded to each of the electrode regions 32c and 32d (whose area is 11.9 mm$^2$). In this case, the output current that flows through each wire 50 is 11.4 A. In addition, six wires 50 are bonded to the electrode region 32e (whose area is 24.5 mm$^2$). In this case, the output current that flows through the wire 50 is 11.7 A.

In addition, depending on the separation location of an individual one of the electrode regions 32a, 32b, 32c, 32d, and 32e in the extension direction from the gate 31 to the edge portion facing the gate 31, a different current flows through the unit number of wires 50. Thus, depending on the location of an individual one of the electrode regions 32a, 32b, 32c, 32d, and 32e, a predetermined number of wires 50 are connected to the corresponding electrode region. Regarding the electrode regions 32a and 32b (the nearest electrode regions) whose separation location is nearest to the gate 31, the output current that flows through each wire is 15.3 A. Regarding the electrode region 32e (the farthest electrode region) whose separation location is farthest from the gate 31, the output current that flows through each wire is 11.7 A. Regarding the electrode regions 32c and 32d (the intermediate electrode regions) located between the nearest electrode regions 32a and 32b and the farthest electrode region 32e, the output current that flows through each wire is 11.4 A. That is to say, the output current per unit number of wires 50 in the nearest electrode regions 32a and 32b is the largest. The output current per unit number of wires 50 in the farthest electrode region 32e is the smallest. The output current per unit number of wires 50 in the intermediate electrode regions 32c and 32d is between the above output currents. In this way, when currents are outputted from the electrode regions 32a, 32b, 32c, 32d, and 32e, the heat generated by the individual wires 50 is reduced.

In addition, the description with reference to FIG. 4 has been made based on an example in which the center region 34a1 and the peripheral region 34a2 around the center region 34a1 are set on the front surface 34 as a region where no wires 50 are bonded and a region where the wires 50 are bonded. Other than this example, a center region 34b1 and peripheral regions 34b2 and 34b3 may be set as illustrated in FIG. 5. That is, as illustrated in FIG. 5, the center region 34b1 is set as a range defined by the width of the individual long side of the gate 31 and the length from the gate 31 to the edge portion facing the gate 31. In addition, the peripheral regions 34b2 and 34b3 are set on both sides of the center region 34b1. In addition, an extension center region 34b7 is set ahead in the extension direction of the gate runner 33 in the center region 34b1. The extension center region 34b7 corresponds to the extension center region 34a7 in FIG. 4 and is located between the peripheral regions 34b2 and 34b3.

Figure 6:
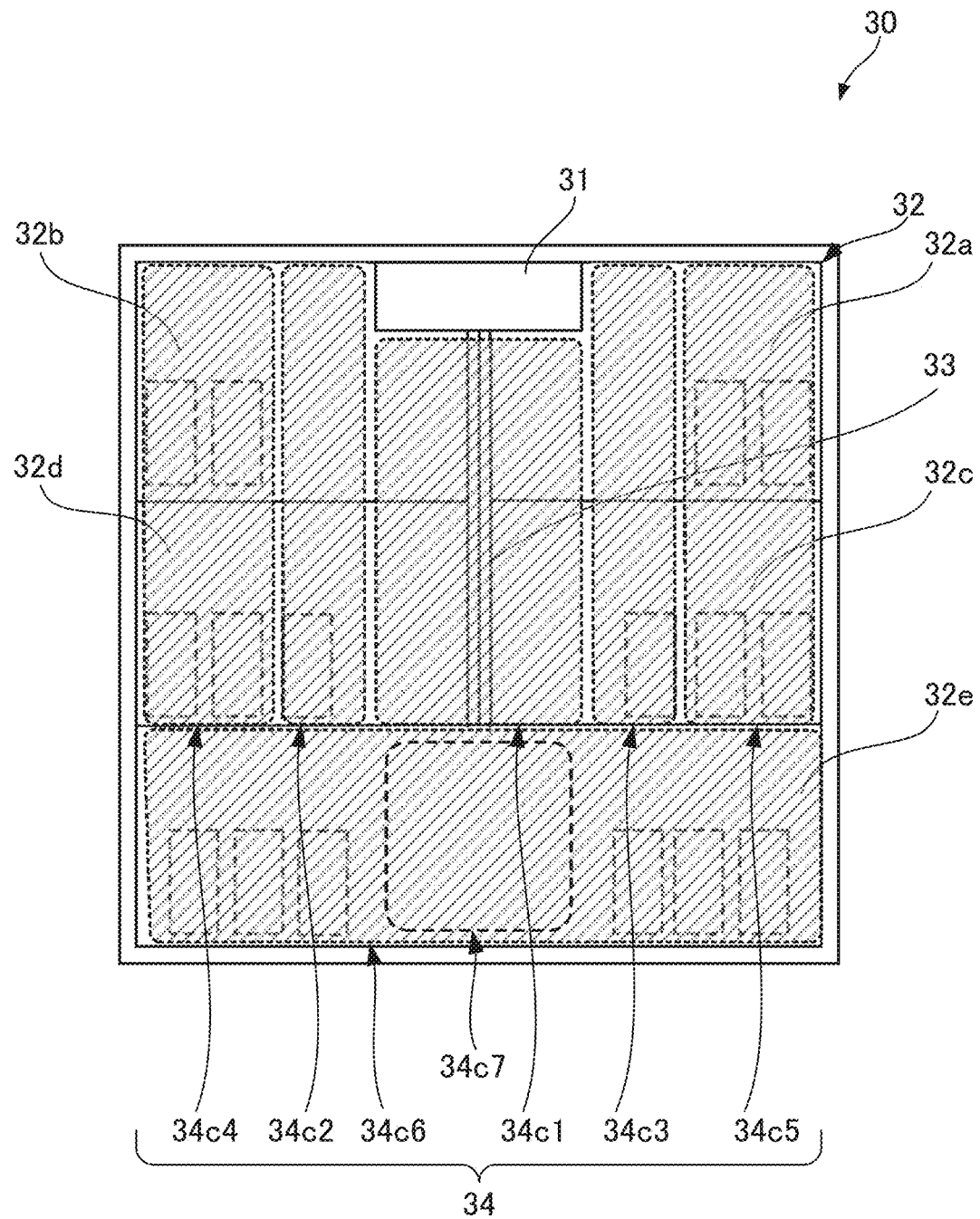
FIG. 6 is a third diagram illustrating the wire bonding portions of the semiconductor chip according to the embodiment.

Next, another example of the regions set on the front surface 34 of the semiconductor chip 30 will be described with reference to FIG. 6. FIG. 6 illustrates wire bonding portions of the semiconductor chip according to the embodiment. The front surface 34 of the semiconductor chip 30 may be set as follows based on how the temperatures in the individual regions rise. As illustrated in FIG. 6, the front surface 34 of the semiconductor chip 30 includes a center region 34c1, inner peripheral regions 34c2 and 34c3, outer peripheral regions 34c4 and 34c5, and a farthest peripheral region 34c6. The center region 34c1 is a region defined by the width of the individual long side of the gate 31 on the front surface 34 and the length of the gate runner 33. The inner peripheral regions 34c2 and 34c3 are peripheral regions on both sides of the center region 34c1 in the extension direction thereof and are near the gate runner 33. The outer peripheral regions 34c4 and 34c5 are regions on the outer sides of the inner peripheral regions 34c2 and 34c3. The farthest peripheral region 34c6 is a peripheral region farthest from the gate 31. In the farthest peripheral region 34c6, an extension center region 34c7 is set ahead in the extension direction of the center region 34c1. As described above, it is thought that the temperature of the center region 34c1 becomes higher than those of the inner peripheral regions 34c2 and 34c3, the outer peripheral regions 34c4 and 34c5, and the farthest peripheral region 34c6. In addition, since the temperature of a region nearer to the gate runner 33 becomes higher, it is thought that the temperature of the inner peripheral regions 34c2 and 34c3 becomes higher than that of the outer peripheral regions 34c4 and 34c5. In addition, it is thought the temperature of a region farther from the extension center region 34c7 in the farthest peripheral region 34c6 is lower.

Figure 7:
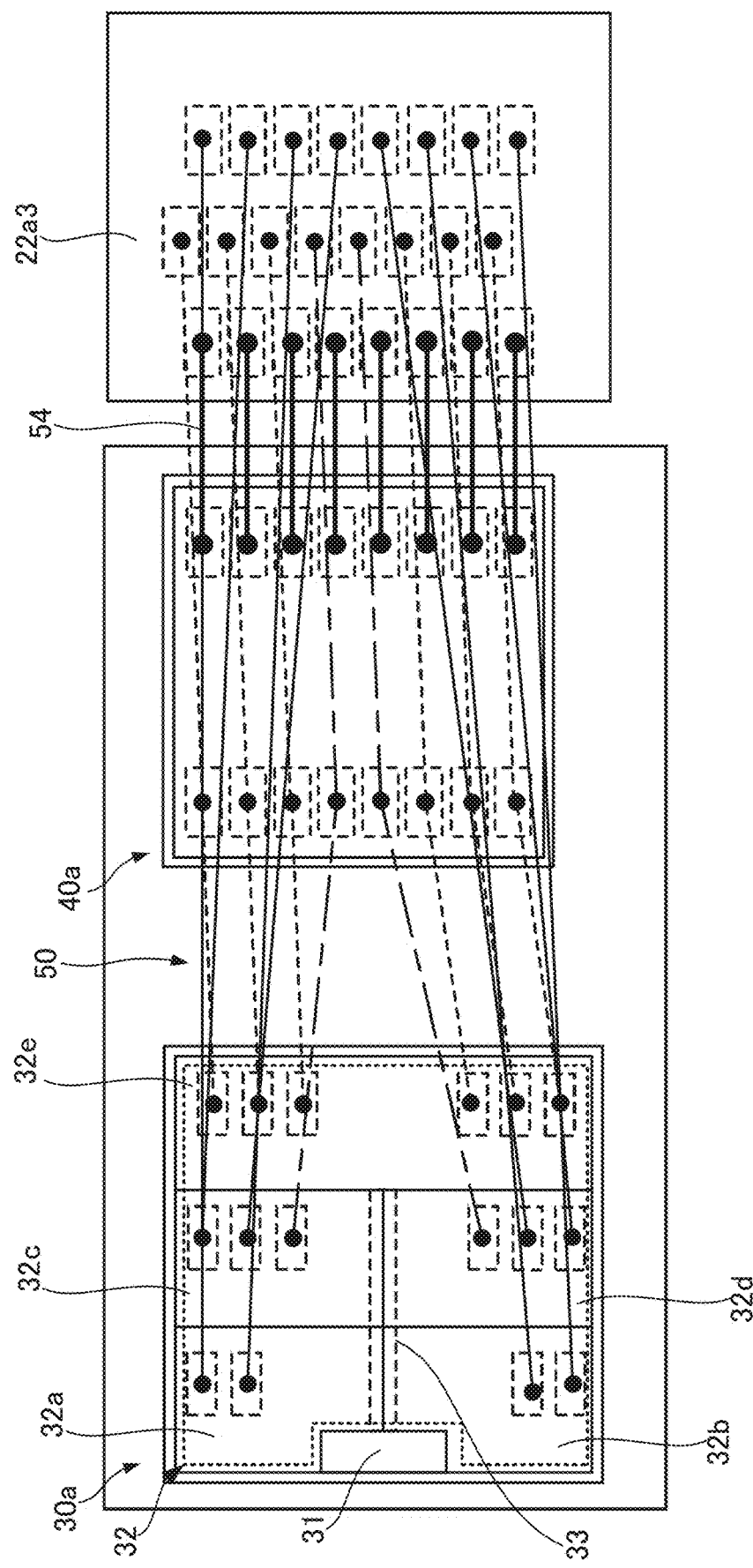
FIG. 7 is a plan view illustrating wire bonding of semiconductor chips of the semiconductor device according to the embodiment.
Figure 8:
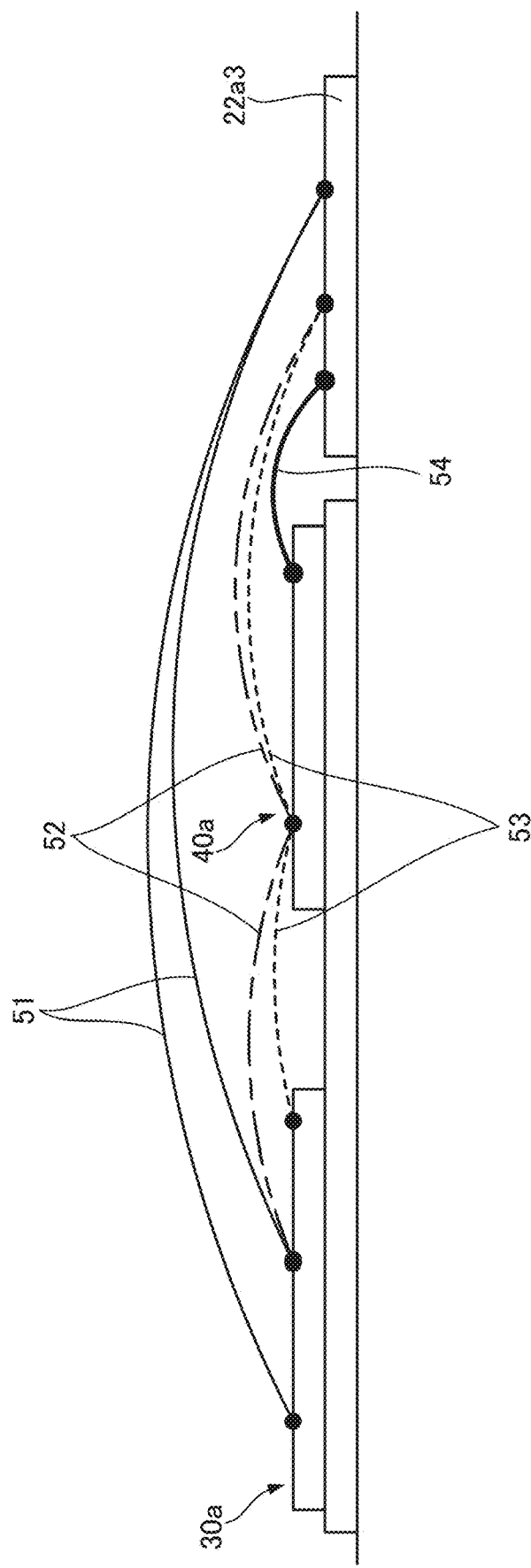
FIG. 8 is a side view illustrating wire bonding of the semiconductor chips of the semiconductor device according to the embodiment.
Figure 9:
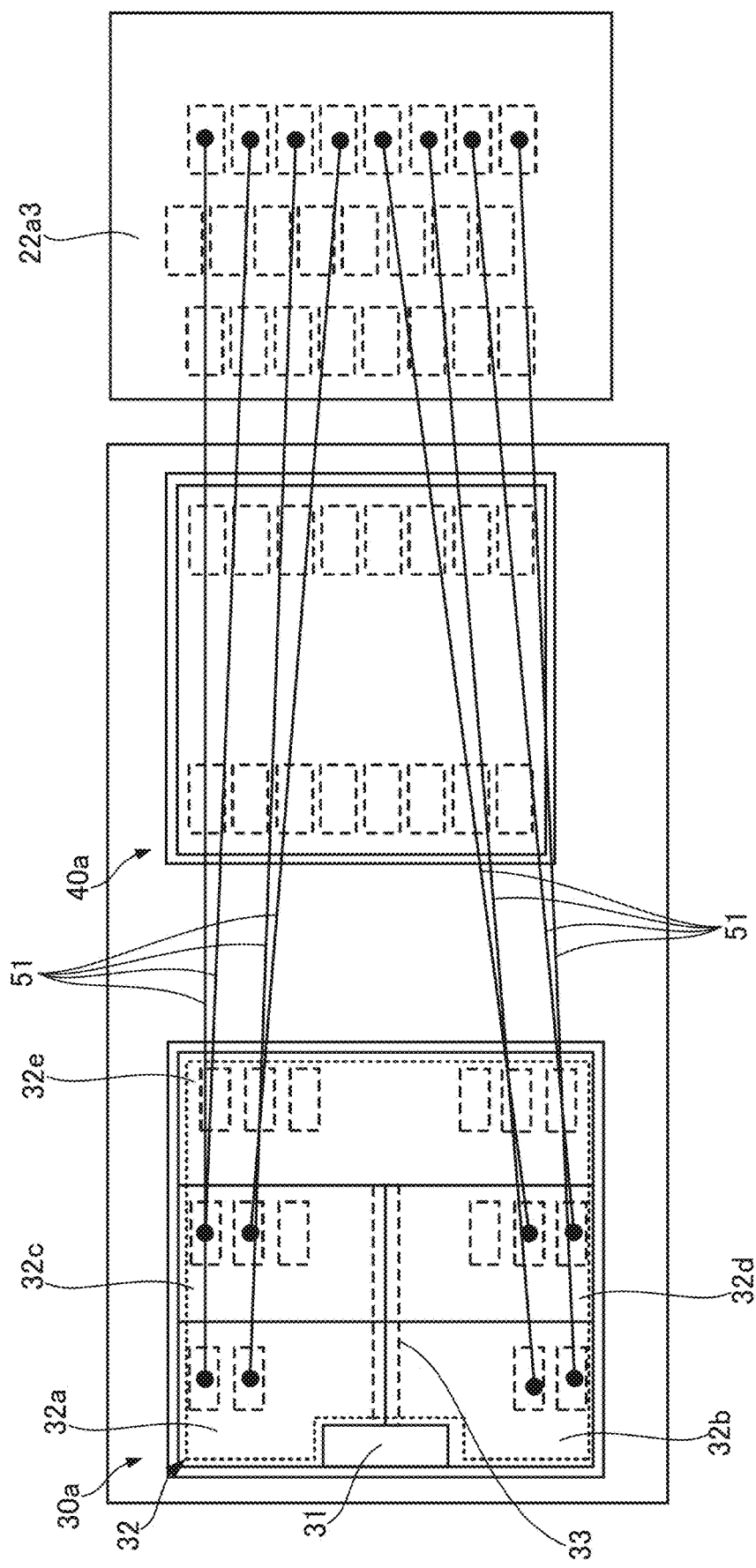
FIG. 9 is a first plan view illustrating wire bonding at bonding portions of a semiconductor chip of the semiconductor device according to the embodiment.
Figure 10:
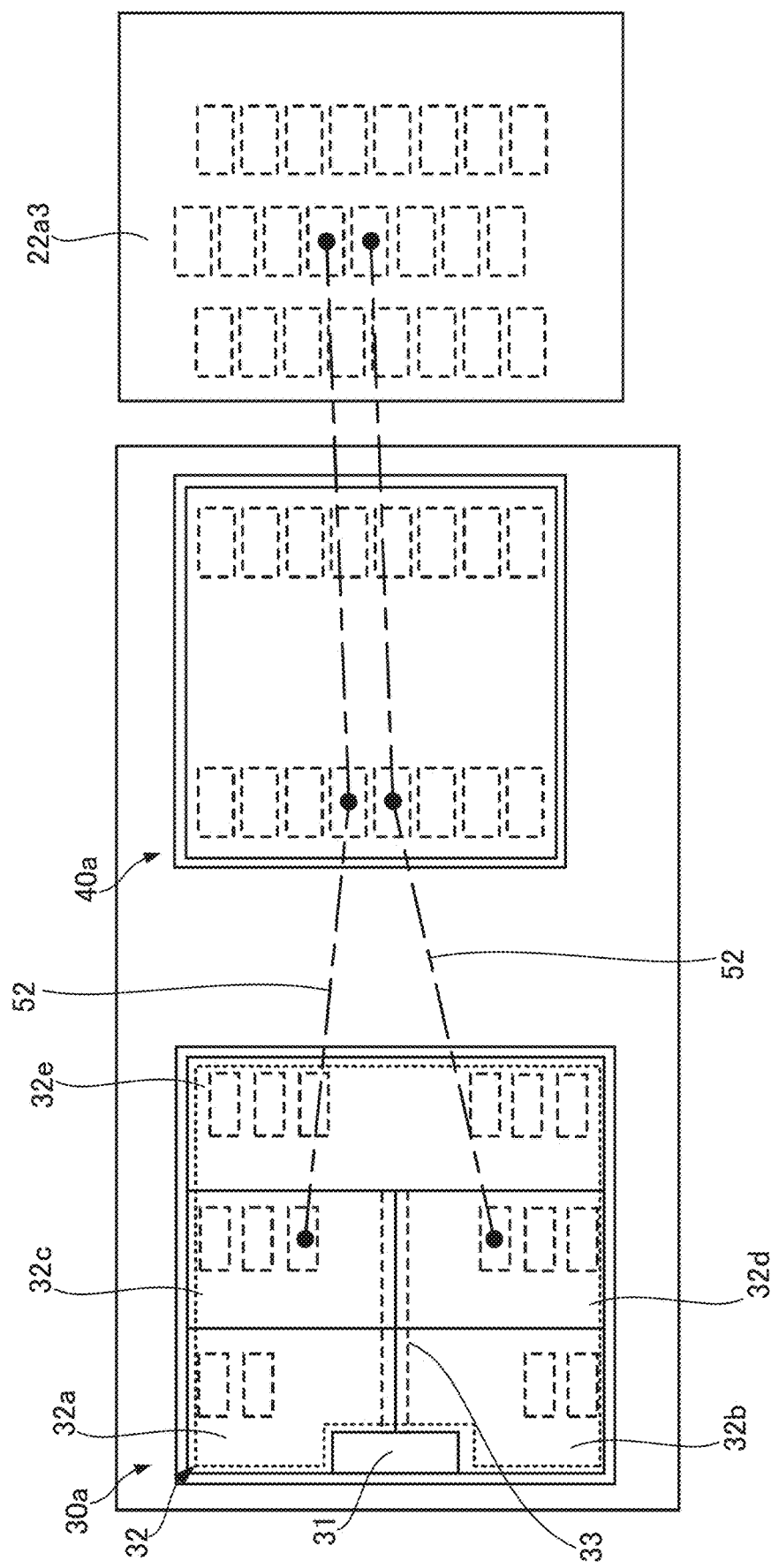
FIG. 10 is a second plan view illustrating wire bonding at bonding portions of the semiconductor chips of the semiconductor device according to the embodiment.
Figure 11:
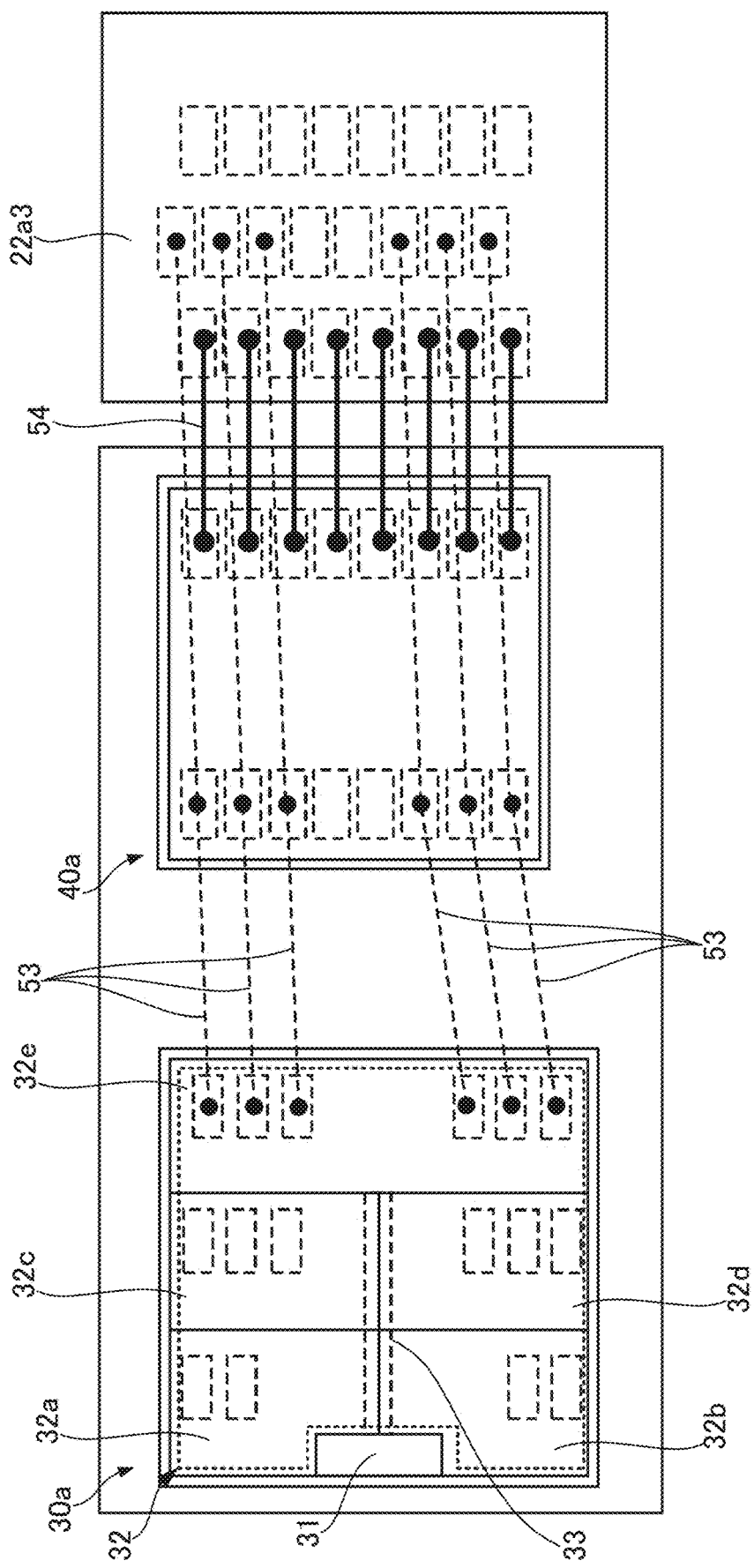
FIG. 11 is a third plan view illustrating wire bonding at bonding portions of the semiconductor chips of the semiconductor device according to the embodiment.

Next, wire bonding among the semiconductor chips 30a and 40a and the conductive pattern 22a3 of the semiconductor device 10 will be described in detail with reference to FIGS. 7 to 11 and FIG. 6. FIG. 7 is a plan view illustrating wire bonding of semiconductor chips of the semiconductor device according to the embodiment. FIG. 8 is a side view illustrating wire bonding of the semiconductor chips of the semiconductor device according to the embodiment. FIGS. 9 to 11 are each a plan view illustrating wire bonding at bonding portions of an individual semiconductor chip of the semiconductor device according to the embodiment. FIG. 7 and FIGS. 9 to 11 are plan views illustrating only main portions of the semiconductor chips 30a and 40a and the conductive pattern 22a3 in FIG. 2. FIG. 8 is a side view illustrating only main portions of the semiconductor chips 30a and 40a and the conductive pattern 22a3 in FIG. 2. In addition, FIGS. 9 to 11 illustrate the wires 51, 52, and 53, respectively, among the wires 50 in FIGS. 7 and 8. The semiconductor chips 30b and 40b and the conductive patterns 22b3 and 22b4 may be bonded in the same way as with the semiconductor chips 30a and 40a and the conductive pattern 22a3 to be described below.

As illustrated in FIG. 7, a semiconductor chip 30a, a semiconductor chip 40a located opposite to the gate 31 of the semiconductor chip 30a, and the conductive pattern 22a3 at a location beside the semiconductor chip 40a, the location being opposite to the semiconductor chip 30a, are disposed on the heat radiation plate 60 (not illustrated in FIG. 7). The semiconductor chips 30a and 40a and the conductive pattern 22a3 are connected to each other via the wires 50. The semiconductor chip 40a and the conductive pattern 22a3 are electrically connected to each other via wires 54. In FIG. 7, the illustration of the wires 55a in FIG. 2 is omitted. In addition, FIG. 7 illustrates an example in which the wires 50 are connected to the conductive pattern 22a3 of the ceramic circuit board 20a. In addition to the conductive pattern 22a3 of the ceramic circuit board 20a, the wires 50 may be connected to conductive members such as other semiconductor chips and conductive plates.

First, as illustrated in FIGS. 9 and 8, among the wires 50, the wires 51 electrically and directly connect the electrode regions 32a and 32b in the active region 32 of the semiconductor chip 30a to the conductive pattern 22a3. In addition, the wires 51 electrically and directly connect the edge portions in the electrode regions 32c and 32d in the active region 32 of the semiconductor chip 30a to the conductive pattern 22a3. That is, the wires 51 are connected to the outer peripheral regions 34c4 and 34c5 illustrated in FIG. 6 in the electrode regions 32c and 32d. The temperature of the outer peripheral regions 34c4 and 34c5 is lower than those of the center region 34c1 and the inner peripheral regions 34c2 and 34c3. Thus, since the amount of heat that is generated by the electrode regions 32c and 32d and that conducts to the conductive pattern 22a3 via the wires 51 is sufficiently small, occurrence of peeling or the like at the portions where the wires 51 and the conductive pattern 22a3 are connected is suppressed.

Among the wires 50, as illustrated in FIGS. 10 and 8, the wires 52 electrically connect the inner portions (near the gate runner 33) in the electrode regions 32c and 32d in the active region 32 of the semiconductor chip 30a to the conductive pattern 22a3. In this case, the wires 52 are also connected to main electrodes of the semiconductor chip 40a between the semiconductor chip 30a and the conductive pattern 22a3. That is, the wires 52 are connected to the inner peripheral regions 34c2 and 34c3 in FIG. 6 in the electrode regions 32c and 32d. While the temperature of the inner peripheral regions 34c2 and 34c3 is lower than the center region 34c1, this temperature is higher than that of the outer peripheral regions 34c4 and 34c5. Thus, if the electrode regions 32c and 32d (the inner peripheral regions 34c2 and 34c3) and the conductive pattern 22a3 are directly connected via the wires 52, it is thought that the amount of heat that conducts to the conductive pattern 22a3 via the wires 52 is relatively large. Thus, peeling or the like at the portions where the wires 52 are connected to the conductive pattern 22a3 may occur. Thus, when the electrode regions 32c and 32d (the inner peripheral regions 34c2 and 34c3) are connected to the conductive pattern 22a3, the wires 52 are also connected to the semiconductor chip 40a. In this way, part of the heat generated by the electrode regions 32c and 32d (the inner peripheral regions 34c2 and 34c3) is released by the semiconductor chip 40a. Thus, since the amount of heat that is generated by the electrode regions 32c and 32d (the inner peripheral regions 34c2 and 34c3) and that conducts to the conductive pattern 22a3 via the wires 52 is reduced, the occurrence of peeling or the like at the portions where the wires 52 and the conductive pattern 22a3 are connected is suppressed.

As illustrated in FIGS. 11 and 8, among the wires 50, the wires 53 electrically connect the electrode region 32e in the active region 32 of the semiconductor chip 30a to the conductive pattern 22a3. The wires 53 are also connected to main electrodes of the semiconductor chip 40a between the semiconductor chip 30a and the conductive pattern 22a3. Since the wires 54 electrically connect the conductive pattern 22a3 and the semiconductor chip 40a, currents easily flow through the electrode region 32e, which is far away from the gate 31 of the semiconductor chip 30a, via the wires 53. The wires 53 are connected to portions outside the extension center region 34c7 in the farthest peripheral region 34c6 illustrated in FIG. 6 and in the electrode region 32e. Thus, the amount of heat that conducts from the electrode region 32e via the wires 53 is reduced. In this way, occurrence of peeling or the like at the portions where the electrode region 32e (the farthest peripheral region 34c6) and the wires 53 are connected is suppressed. In addition, part of the heat from the electrode region 32e (the farthest peripheral region 34c6) is released by the semiconductor chip 40a. Thus, since the amount of heat that conducts from the electrode region 32e (the farthest peripheral region 34c6) to the conductive pattern 22a3 via the wires 53 is reduced, the occurrence of peeling or the like at the portions where the wires 53 are connected to the conductive pattern 22a3 is suppressed.

The above semiconductor device 10 includes a semiconductor chip 30 including, on a front surface, an active region 32 formed by the electrode regions 32a, 32b, 32c, 32d, and 32e, each of which outputs an output current. In addition, at least one wire 50 is connected to each of the electrode regions 32a, 32b, 32c, 32d, and 32e. In addition, with the semiconductor device 10, a predetermined number of wires 50 are connected to an individual one of the electrode regions 32a, 32b, 32c, 32d, and 32e so that a current amount per unit number of wires represents a predetermined value or less, the predetermined number depending on the location of the corresponding electrode region. In this way, when currents flow through the wires 50, the heat generated by the wires 50 is reduced.

In addition, the front surface 34 of the individual semiconductor chip 30 has a rectangular shape in a plan view. The individual semiconductor chip 30 further includes the gate 31 that receives a control voltage at a center portion of an edge portion of the front surface 34 and the gate runner 33 that extends from the gate 31 to a predetermined location in the extension direction from the gate 31 to an edge portion facing the gate 31. In addition, the electrode regions 32a, 32b, 32c, 32d, and 32e are arranged along the extension direction on both sides of the gate runner 33, and the number of wires 50 connected to an individual electrode region differs depending on the separation location of the corresponding one of the electrode regions 32a, 32b, 32c, 32d, and 32e in the extension direction from the gate 31. In this way, when a current flows through a wire, the heat generated by the wire 50 is further reduced, and the reduction in the power cycle lifetime and reliability of the semiconductor device 10 is prevented.

Figure 12:
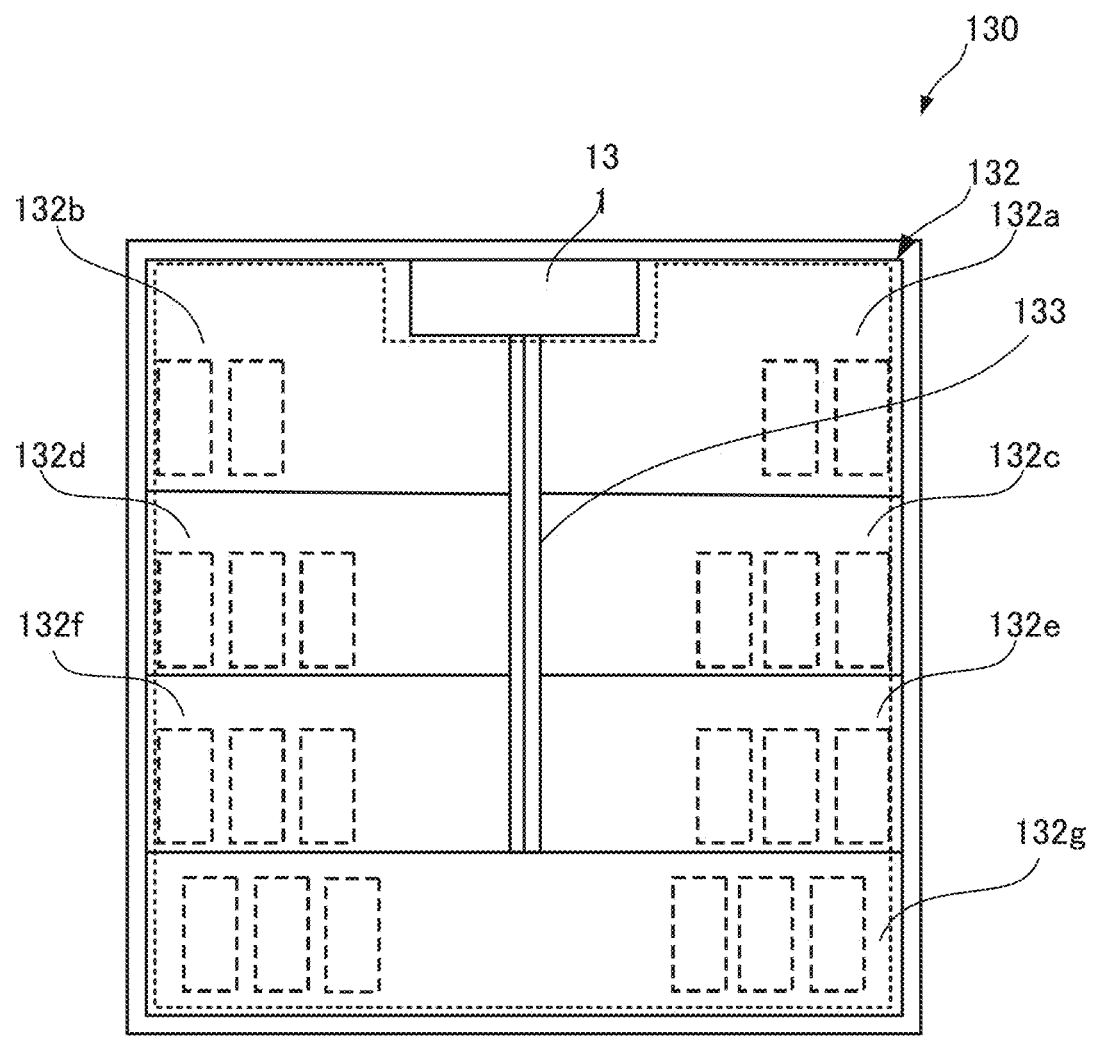
FIG. 12 is a plan view of another semiconductor chip according to the embodiment.

The above description assumes an example in which a semiconductor chip is divided into three rows (the electrode regions 32a and 32b, the electrode regions 32c and 32d, and the electrode region 32e) in the extension direction from the gate 31 to the edge portion facing the gate 31, as with the semiconductor chip 30 in FIG. 3. However, the division number is not limited to 3, as with the semiconductor chip 30. Another semiconductor chip will be described with reference to FIG. 12. FIG. 12 is a plan view of another semiconductor chip according to the embodiment.

This semiconductor chip 130 has a rectangular shape in a plan view and includes a gate 131 (a control electrode portion) at a center portion of an edge portion of a front surface and an active region 132 (an output electrode portion), as illustrated in FIG. 12. For example, the vertical size of the semiconductor chip 130 is 12 mm, and the horizontal size is 10 mm. As illustrated in FIG. 12, the active region 132 is formed by four rows of electrode regions 132a and 132b, electrode regions 132c and 132d, electrode regions 132e and 132f, and an electrode region 132g arranged in an extension direction from the gate 131 to an edge portion facing the gate 131. In addition, each of the electrode regions 132a, 132b, 132c, 132d, 132e, 132f, and 132g is a transistor region in which a plurality of IGBTs are formed. The electrode regions 132a, 132b, 132c, 132d, 132e, 132f, and 132g are insulated from each other and each output a separate output current. On the transistor regions, a gate runner 133 electrically connected to the gate 131 is formed in the direction from the gate 131 to the edge portion facing the gate 131. The gate runner 133 extends along the boundary between the electrode regions 132a, 132c and 132e, and the electrode regions 132b, 132d and 132f up to the electrode region 132g. That is, the electrode regions 132a and 132b, the electrode regions 132c and 132d, and the electrode regions 132e and 132f are arranged sequentially in this direction on both sides of the gate runner 133. In addition, in the active region 132, an electrode region that is separated farther from the gate 131 along the gate runner 133 has a larger area.

In the case of the semiconductor chip 130, too, as illustrated in FIG. 12, the wires 50 are bonded to the dashed rectangular regions in the electrode regions 132a, 132b, 132c, 132d, 132e, 132f, and 132g. In addition, in this case, too, a predetermined number of wires 50 per unit area or less are connected to an individual one of the electrode regions 132a, 132b, 132c, 132d, 132e, 132f, and 132g, the predetermined number depending on the area of the corresponding electrode region 132a, 132b, 132c, 132d, 132e, 132f, or 132g.

In addition, the current that is allowed to flow per unit number of wires 50 differs depending on the separation location of the connected one of the electrode regions 132a, 132b, 132c, 132d, 132e, 132f, and 132g in the extension direction from the gate 131 to the edge portion facing the gate 131. The output current per unit number of wires 50 in the electrode regions 132e and 132f (an intermediate electrode region) is the smallest. The output current per unit number of wires 50 in the electrode regions 132c and 132d (an intermediate electrode region) is the second smallest. The output current per unit number of wires 50 in the electrode region 132g (farthest electrode region) is the second largest. The output current per unit number of wires 50 in the electrode regions 132a and 132b (the nearest electrode region) is the largest. In this way, when currents are outputted from the electrode regions 132a, 132b, 132c, 132d, 132e, 132f, and 132g, the heat generated by the individual wires 50 is reduced.

In addition, the setting of the regions as illustrated in FIGS. 4 to 6 is also applicable to the semiconductor chip 130. When FIG. 4 is applied, the center region 34a1 defined by the width of the individual long side of the gate 131 and the length of the gate runner 133 and the peripheral region 34a2 around the center region 34a1 are set. When FIG. 5 is applied, the center region 34b1 is set as the range defined by the width of the individual long side of the gate 131 and the length from the gate 131 to the edge portion facing the gate 131. In addition, the peripheral regions 34b2 and 34b3 are set on both sides of the center region 34b1.

When FIG. 6 is applied, the center region 34c1 is set as the region defined by the width of the individual long side of the gate 131 and the length of the gate runner 133. The inner peripheral regions 34c2 and 34c3 are set as the peripheral regions that are located on both sides of the center region 34c1 and near the gate runner 133. That is, the inner peripheral regions 34c2 and 34c3 include bonding portions of the electrode regions 132c, 132d, 132e, and 132f near the gate runner 133. Outer regions of the inner peripheral regions 34c2 and 34c3 are set as the outer peripheral regions 34c4 and 34c5. The peripheral region (electrode region 132g) farthest from the gate 131 is set as the farthest peripheral region 34c6. If this semiconductor chip 130 is applied in place of the semiconductor chip 30a in FIG. 7, the wires 50 connected to the inner peripheral regions 34c2 and 34c3, the outer peripheral regions 34c4 and 34c5, and the farthest peripheral region 34c6 are connected to the conductive pattern 22a3 as in FIG. 7. As is the case with the semiconductor chip 30a, the semiconductor chip 130 achieves reduction of the heat generated by the wires 50 when currents flow through the wires 50.

According to the present technique, sufficient power cycle lifetime and the reliability of a semiconductor device are secured.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a first semiconductor chip including an output electrode portion on a front surface thereof, the output electrode portion including a plurality of electrode regions, each of which is provided at a respective position of the output electrode portion; and
   a plurality of wires, each electrode region being connected to a different one or more wires among the plurality of wires, through which a respective amount of output current is output, wherein
   a respective total number of the different one or more wires connected to each electrode region is set depending on the respective position of said each electrode region, so that a respective current amount of each of the different one or more wires connected to said each electrode region is equal to or less than a respective predetermined value associated with said each electrode region,
   wherein the front surface of the first semiconductor chip has a rectangular shape having four edge portions in a plan view and further includes a control electrode portion that receives a control voltage, the control electrode portion being provided at one of the four edge portions of the front surface of the first semiconductor chip,
   wherein the plurality of electrode regions are arranged in an extension direction from the control electrode portion to an other one of the four edge portions facing the one of the four edge portions in which the control electrode portion is provided,
   wherein the plurality of electrode regions each have a respective separation distance from the control electrode portion in the extension direction, and include a nearest electrode region that has a first separation distance, a farthest electrode region that has a second separation distance, and an intermediate electrode region that has a third separation distance, the first separation distance being smaller than the second and third separation distances, the second separation distance being greater than the third separation distance, and wherein the respective predetermined value associated with each electrode region differs depending on the respective separation distance of said each electrode region.

2. The semiconductor device according to claim 1, wherein the first semiconductor chip includes a switching element.

3. The semiconductor device according to claim 1, wherein the respective predetermined value associated with the intermediate electrode region is the smallest among the respective predetermined values associated with the plurality of electrode regions.

4. The semiconductor device according to claim 3, wherein the respective predetermined value associated with the farthest electrode region is the second smallest next to the respective predetermined value of the intermediate electrode region.

5. The semiconductor device according to claim 1, further comprising a conductive plate that is disposed away from the first semiconductor chip and is located at a side of the first semiconductor chip opposite to a side of the first semiconductor chip in which the control electrode portion is provided, wherein each wire of the plurality of wires connects the output electrode portion at one end of said each wire to the conductive plate at an other end of said each wire.

6. The semiconductor device according to claim 1, wherein the control electrode portion is provided at a center of the one of the four edge portions of the front surface of the first semiconductor chip, wherein the front surface of the first semiconductor chip further includes a gate runner that extends in the extension direction from the control electrode portion to the intermediate electrode region, and wherein each of the nearest electrode region and the intermediate electrode region has a center region having the same width of the control electrode portion in a direction orthogonal to the extension direction, and two peripheral regions at either sides of the center region with respect to the extension direction, each of the different one or more wires connected to each of the nearest electrode region and the intermediate electrode region is connected to one of the two peripheral regions thereof.

7. The semiconductor device according to claim 6, wherein the farthest electrode region has an extension center region having opposite sides and extending from the center region of the intermediate electrode region in the extension direction and each of the different one or more wires connected to the farthest electrode region is connected to one of the opposite sides of the extension center region.

8. The semiconductor device according to claim 1, further comprising:

a second semiconductor chip provided at a side of the first semiconductor chip opposite to a side of the first semiconductor chip in which the control electrode portion is provided, the second semiconductor chip having a second chip on a front surface thereof and including a main electrode;

a conductive plate provided at a side of the second semiconductor chip opposite to a side in which the first semiconductor chip is provided, wherein one of the different one or more wires connected to one of the plurality of electrode regions at one end thereof is connected to the conductive plate at an other end thereof, an intermediate portion between the one end and the other end being connected to the main electrode of the second semiconductor chip.

9. The semiconductor device according to claim 8, wherein the second semiconductor chip includes a diode element.

10. The semiconductor device according to claim 8, wherein each of the different one or more wires connected to the nearest electrode region at one end thereof is directly connected the conductive plate at an other end thereof.

11. The semiconductor device according to claim 8, wherein the one of the plurality of electrode regions to which the one of the different one or more wires connected at the one end thereof is the farthest electrode region.

12. The semiconductor device according to claim 8, wherein the control electrode portion is provided at a center of the one of the four edge portions of the front surface of the first semiconductor chip, wherein the front surface of the first semiconductor chip further includes a gate runner that extends in the extension direction from the control electrode portion to the intermediate electrode region, and wherein each of the nearest electrode region and the intermediate electrode region has a center region having a same width as a width of the control electrode portion in a direction orthogonal to the extension direction, and two peripheral regions at either sides of the center region with respect to the extension direction, each of the different one or more wires connected to each of the nearest electrode region and the intermediate electrode region is connected to one of the two peripheral regions thereof.

13. The semiconductor device according to claim 12, wherein each of the two peripheral regions of the intermediate electrode region includes an inner peripheral region provided adjacent to the gate runner, the main electrode on the second chip is provided in plurality, one of the different one or more wires connected to the intermediate electrode region at one end thereof is connected to the conductive plate at an other end thereof, an intermediate portion between the one end and the other end being connected to one of the main electrodes of the second semiconductor chip.

14. The semiconductor device according to claim 12, wherein each of the two peripheral regions of the intermediate electrode region includes an outer peripheral region provided away from the gate runner, and one of the different one or more wires connected to the intermediate electrode region is connected to the outer peripheral region at one end thereof and is directly connected to the conductive plate at an other end thereof.

* * * * *